(12) United States Patent
Bhattacharya et al.

(10) Patent No.: US 7,936,209 B2
(45) Date of Patent: May 3, 2011

(54) I/O BUFFER WITH LOW VOLTAGE SEMICONDUCTOR DEVICES

(75) Inventors: Dipankar Bhattacharya, Maoungie, PA (US); Makeshwar Kothandaraman, Whitehall, PA (US); John Kriz, Palmerton, PA (US); Jeffrey Nagy, Allentown, PA (US); Yehuda Smooha, Allentown, PA (US); Pankaj Kumar, Bangalorek (IN)

(73) Assignee: LSI Corporation, Milpitas, CA (US)

( * ) Notice: Subject to any disclaimer, the term of this patent is extended or adjusted under 35 U.S.C. 154(b) by 42 days.

(21) Appl. No.: 12/428,556

(22) Filed: Apr. 23, 2009

(65) Prior Publication Data

US 2010/0271118 A1 Oct. 28, 2010

(51) Int. Cl.
  *G05F 1/10* (2006.01)
  *G05F 3/02* (2006.01)
(52) U.S. Cl. ......... 327/543; 327/108; 327/379; 327/391
(58) Field of Classification Search .......... 327/108–112, 327/379, 389, 391, 530, 538–543, 545, 546; 323/312–317; 326/22–27, 81–87
See application file for complete search history.

(56) References Cited

U.S. PATENT DOCUMENTS

| | | | | |
|---|---|---|---|---|
| 5,973,534 | A  * | 10/1999 | Singh | 327/309 |
| 6,054,888 | A  * | 4/2000  | Maley | 327/333 |
| 6,693,469 | B2 * | 2/2004  | Prodanov | 327/108 |
| 7,268,588 | B2 * | 9/2007  | Sanchez et al. | 326/68 |

* cited by examiner

*Primary Examiner* — Lincoln Donovan
*Assistant Examiner* — Brandon S Cole

(57) ABSTRACT

Described embodiments provide for protecting from DC and transient over-voltage conditions an input/output ("I/O") buffer having first and second I/O transistors. The first I/O transistor is coupled to a first over-voltage protection circuit adapted to prevent an over-voltage condition on at least the first I/O transistor. The second I/O transistor is coupled to a second over-voltage protection circuit adapted to prevent an over-voltage condition on at least the second I/O transistor. First and second bias voltages are generated from an operating voltage of the buffer. A third bias voltage is generated from either i) the first bias voltage, or ii) an output signal voltage of the buffer and a fourth bias voltage is generated from either i) the second bias voltage, or ii) the output signal voltage of the buffer. The third and fourth bias voltages are provided to the first and second over-voltage protection circuits, respectively.

14 Claims, 3 Drawing Sheets

I/O BUFFER WITH LOW VOLTAGE SEMICONDUCTOR DEVICES

BACKGROUND OF THE INVENTION

1. Field of the Invention

The present invention relates to generally to integrated circuits, and, in particular, to an input/output buffer using low voltage semiconductor devices.

2. Description of the Related Art

The fabrication of a semiconductor system on chip (SOC) with three gate oxide thicknesses is known as a triple gate oxide (TGO) process. Gate oxide thicknesses associated with metal-oxide semiconductor field effect transistors (MOSFETs or FETs) on the SOC increase as the operating voltage of the FETs increases. Often, a TGO device might have one thin gate oxide for devices in the lower voltage processor core and two thicker gate oxides for higher voltage input and output (I/O) devices. Using two thicker gate oxide layers inherently lowers the yield of devices from the fabricated silicon wafer and adds complexity to the fabrication process. Alternatively, a TGO device might have two thin gate oxide layers and one thick layer. It is desirable to include only two gate oxide thicknesses—one thin and one thick—but this creates a design trade-off between gate oxide thickness and performance, as lower voltage, thinner gate oxide semiconductors are smaller, consume less power, generate less heat, have lower gate and junction capacitances than higher voltage, thicker gate oxide semiconductors. However, higher operating voltages may be required for I/O devices in order to maintain backward compatibility with other devices.

For example, in a computer disk drive SOC, the designers may choose to use 1.8V I/O devices with a gate oxide thickness of 26 Angstroms. Choosing a thinner gate oxide allows the SOC to support higher performance, lower voltage protocols such as SATA (Serial Advanced Technology Attachment) or DDR3 (Double Data Rate version 3). However, the SOC I/O devices may still be required to interface to higher voltage legacy protocols such as ATA (Advanced Technology Attachment) or CE-ATA (Consumer Electronics Advanced Technology Attachment). Therefore, thinner gate oxide SOC I/O devices might require circuitry to prevent the device from operating in an over-voltage condition that could damage the I/O device.

FIG. 1 shows a schematic diagram of prior art system on chip (SOC) I/O device 100. Input node 102 and input node 122 are configured to receive signals provided from a core of the SOC (not shown). Signals provided to input node 102 may be used to control I/O transistor 112 and signals provided to input node 122 may be used to control I/O transistor 132. Signals received by input nodes 102 and 122 are provided to voltage translator 104 and voltage translator 124, respectively. Voltage translators 104 and 124 are configured to shift the voltage between the low voltage used by the SOC core and the higher voltage, for example Vddio 108, used by I/O device 100. For example, the SOC core might operate at 1.5V, while the SOC I/O might operate at a Vddio of 3.3V, etc. The outputs of voltage translators 104 and 124 are provided to I/O transistor pre-drivers 106 and 126, respectively.

I/O transistor pre-driver 106 and I/O transistor pre-driver 126 are configured to provide adequate biasing to drive I/O transistor 112 and I/O transistor 132, respectively. I/O transistor pre-driver 106 is electrically coupled between voltages Vddio 108 and VPbias 110 and I/O transistor pre-driver 126 is electrically coupled between voltages VNbias 128 and Vss 130. I/O transistor pre-driver 106 provides gate drive signal VPG 111 to I/O transistor 112 and I/O transistor pre-driver 126 provides gate drive signal VNG 131 to I/O transistor 132. Gate drive signals VPG 111 and VNG 131 are configured to drive I/O transistors 112 and 132, respectively.

Voltages VNbias 128 and VPbias 110, which drive the gates of MNIOB 134 and MPIOB 114, respectively, are derived from Vddio 108. Typically, VNbias 128 and VPbias 110 are chosen to be a constant ratio of Vddio 108 such that the DC voltage across any two terminals of I/O transistors 112 and 132 does not exceed the maximum allowable voltage, Vmax, across any two terminals of the transistor. VNbias 128 and VPbias 110 might be, but are not necessarily, substantially equal.

As shown, I/O transistor 112 comprises a P-channel FET and I/O transistor 132 comprises an N-channel FET. Further, over-voltage protection circuit 114 comprises a P-channel FET and over-voltage protection circuit 134 comprises an N-channel FET. Thus, signal VPG 111 is configured to turn I/O transistor 112 on and off, and signal VNG 131 is configured to turn I/O transistor 132 on and off. As used in this specification, and as would be understood by one of skill in the art, the terms "on" and "off" refer to the transistor being in conducting mode or non-conducting mode, respectively. For example, to turn on I/O transistor 132, signal VNG 131 is configured to be greater than or equal to the threshold voltage, Vth, of I/O transistor 132. When I/O transistors 112 and 132 are 1.8V devices with a gate oxide thickness of 26 Angstroms, the threshold voltage, Vth, might be approximately 0.5V.

PAD 140 provides electrical communication with devices outside of I/O device 100, for example, such as devices located on separate silicon dies or separate chips on an external printed circuit board. PAD 140 is configured to be set to a high voltage level (approximately Vddio 108) or a low voltage level (approximately Vss 130). I/O transistor 132 is configured to pull the voltage of PAD 140 down to a low level, approximately Vss 130, when I/O transistor 132 is on and I/O transistor 112 is off. Similarly, I/O transistor 112 is configured to pull the voltage of PAD 140 up to a high level, approximately Vddio 108, when I/O transistor 112 is on and I/O transistor 132 is off.

Generally, I/O transistor 112 may be connected directly between Vddio 108 and PAD 140, and I/O transistor 132 may be connected directly between PAD 140 and Vss 130. However, to protect I/O transistors 112 and 132 from experiencing DC over-voltage conditions, over-voltage protection circuits 114 and 134 are configured to reduce exposure of I/O transistors 112 and 132, respectively, to DC over-voltage conditions.

In operation, when the voltage of PAD 140 is pulled high to approximately Vddio 108, and Vddio 108 is 3.3V, the voltage of PAD 140 may reach as high as 3.6V (e.g., 3.3V+10% worst case tolerance). When the voltage of PAD 140 is pulled high, I/O transistor MNIOA 132 is off. If over-voltage protection transistor MNIOB 134 were not present, I/O transistor MNIOA 132 could be subject to a DC over voltage condition. As would be understood by one of skill in the art, the drain to source voltage, Vds, of MNIOA 132 might be as high as 3.6V. Conversely, when the voltage of PAD 140 is pulled low, I/O transistor MPIOA 112 might have a Vds as high as 3.6V. However, when I/O transistors 112 and 132 are 1.8V devices with a gate oxide thickness of 26 Angstroms, the maximum allowable voltage, Vmax, across any two terminals of the transistor is approximately 1.98V.

Therefore, over-voltage protection transistor MNIOB 134 is intended to limit the DC voltage across any two terminals of I/O transistor MNIOA 132 and over-voltage protection transistor MPIOB 114 is similarly intended to limit the DC voltage across any two terminals of I/O transistor MPIOA 112. As would be apparent to one of skill in the art, an analysis might be performed to show that transistors 112, 114, 132 and 134 are not subject to DC over-voltage conditions regardless of whether the voltage of PAD 140 is pulled high or low.

While transistors 112, 114, 132 and 134 might be protected from DC over-voltage conditions, they might not be protected from transient over-voltage conditions. For example, if PAD 140 is coupled to a capacitive load, such that the rate of charging or discharging PAD 140 is slower than charging or discharging the source of MPIOB 114 or the source of MNIOB 134, transient voltages exceeding Vmax may appear across the nodes of transistors 114 and 134. Depending on the peak and duration of these transient voltages, the lifetime of the transistors may be degraded.

SUMMARY OF THE INVENTION

In an exemplary embodiment, the present invention provides for protecting from DC and transient over-voltage conditions an input/output ("I/O") buffer having first and second I/O transistors. The first I/O transistor is coupled to a first over-voltage protection circuit adapted to prevent an over-voltage condition on at least the first I/O transistor. The second I/O transistor is coupled to a second over-voltage protection circuit adapted to prevent an over-voltage condition on at least the second I/O transistor. First and second bias voltages are generated from an operating voltage of the buffer. A third bias voltage is generated from either i) the first bias voltage, or ii) an output signal voltage of the buffer and a fourth bias voltage is generated from either i) the second bias voltage, or ii) the output signal voltage of the buffer. The third and fourth bias voltages are provided to the first and second over-voltage protection circuits, respectively.

BRIEF DESCRIPTION OF THE DRAWINGS

Other aspects, features, and advantages of the present invention will become more fully apparent from the following detailed description, the appended claims, and the accompanying drawings in which like reference numerals identify similar or identical elements.

FIG. 3 shows an exemplary embodiment of the I/O device of FIG. 2.

DETAILED DESCRIPTION

As described herein, embodiments of the present invention provide a method and system for an input/output (I/O) buffer, such as a 3V I/O buffer, using low voltage semiconductor devices, such as 1.8V semiconductor devices, that protect elements of the buffer from DC and transient over-voltage conditions. So as not to obscure the invention, some specific details of the various embodiments that are within the knowledge of a person of ordinary skill in the art may not be discussed herein.

Figure 1:
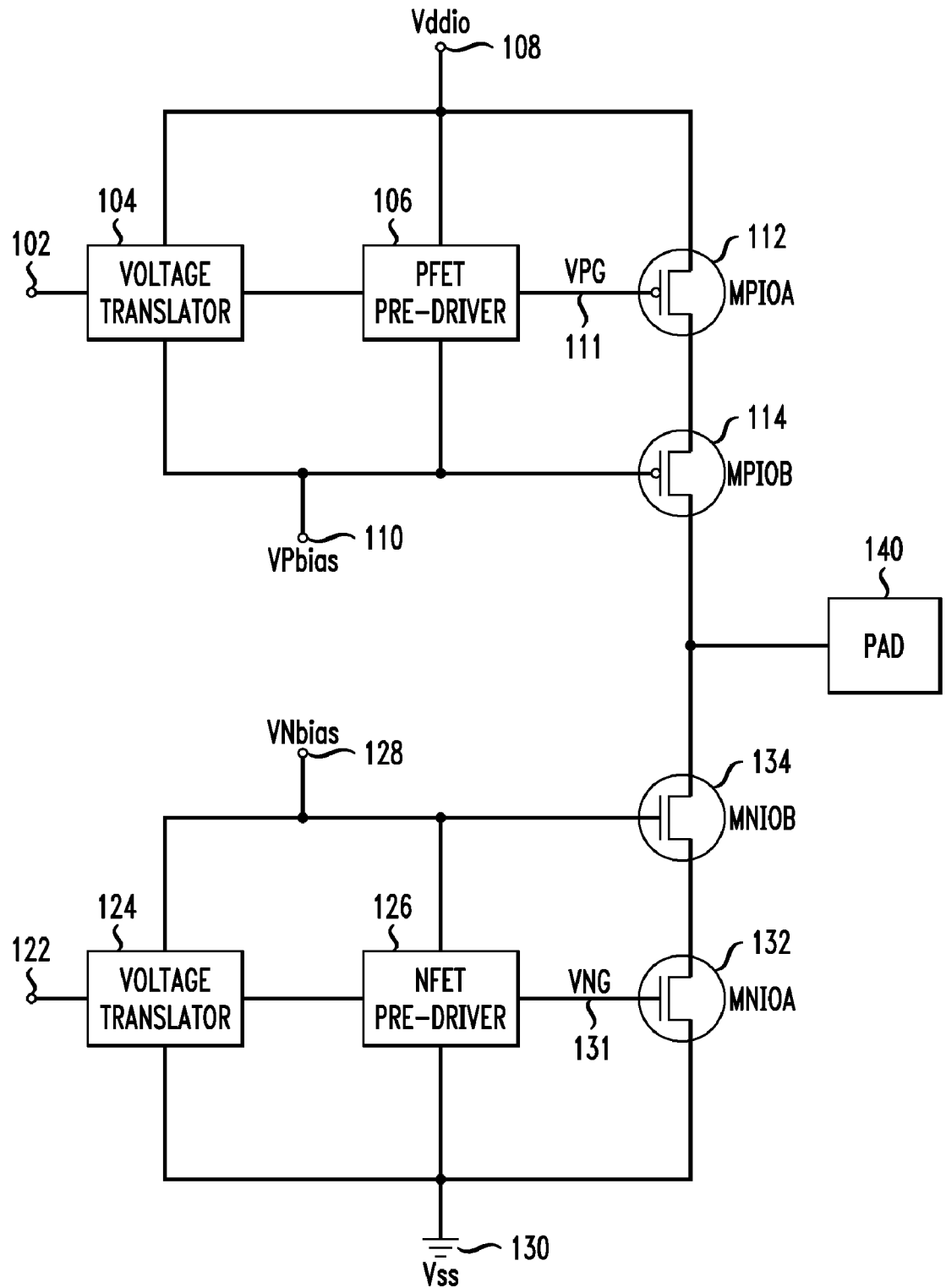
FIG. 1 shows a schematic of a prior art system on chip (SOC) I/O device.
Figure 2:
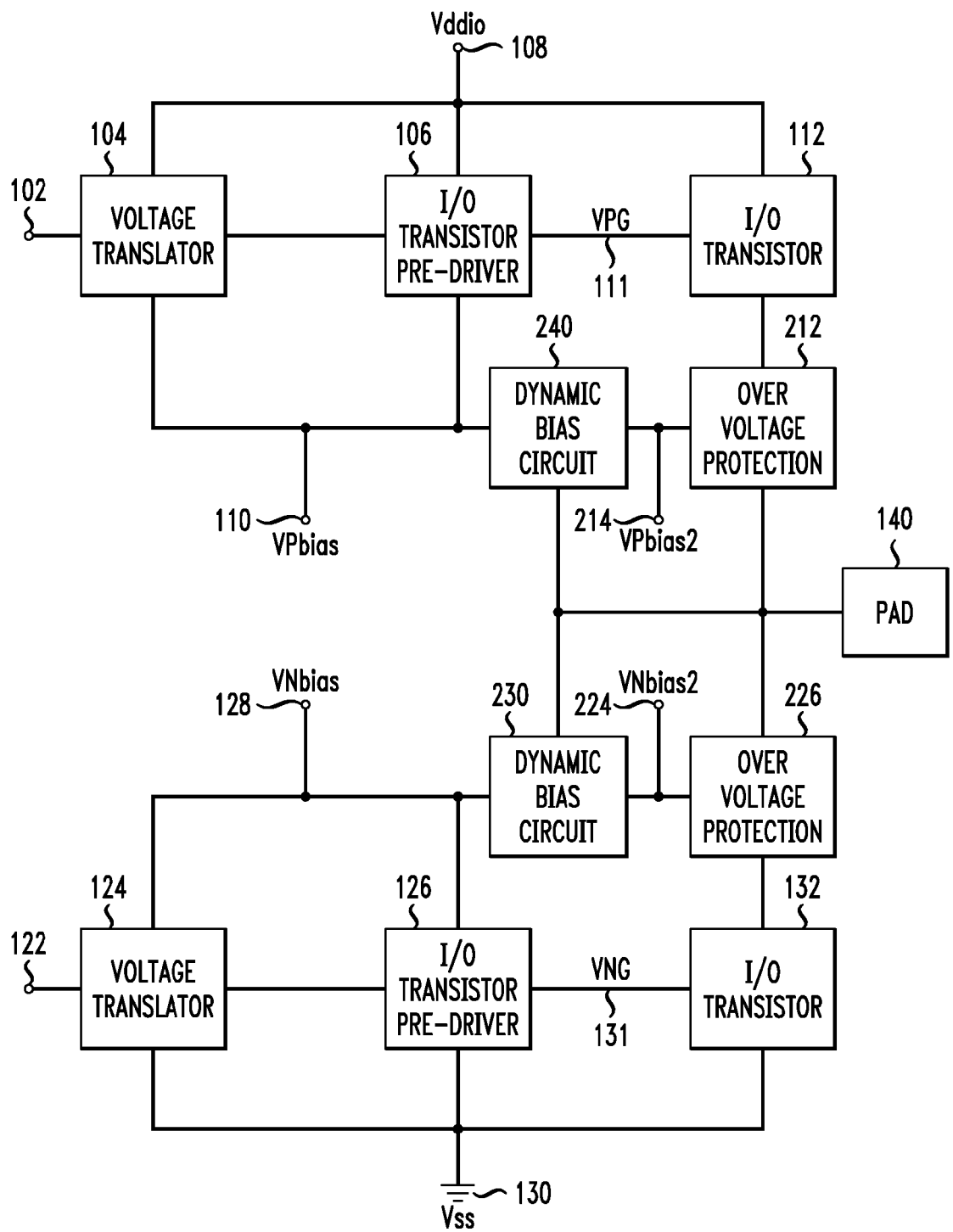
FIG. 2 shows a block diagram of an I/O device in accordance with an exemplary embodiment of the present invention.

FIG. 2 shows a block diagram of I/O device 200 in accordance with an exemplary embodiment of the present invention. As shown in FIG. 2, I/O device 200 comprises input node 102 and input node 122, voltage translator 104 and voltage translator 124, I/O transistor pre-driver 106 and I/O transistor pre-driver 126, and I/O transistor 112 and I/O transistor 132, such as described previously with respect to FIG. 1.

An embodiment of the present invention additionally comprises over-voltage protection circuit 212, over-voltage protection circuit 226, dynamic bias circuit 230 and dynamic bias circuit 240. Dynamic bias circuit 230 is electrically coupled to over-voltage protection circuit 226, PAD 140 and VNbias 128. Dynamic bias circuit 240 is electrically coupled to over-voltage protection circuit 212, PAD 140 and VPbias 110. Dynamic bias circuit 230 is adapted to dynamically provide bias voltage VNbias2 224 to over-voltage protection circuit 226, and dynamic bias circuit 240 is adapted to dynamically provide bias voltage VPbias2 214 to over-voltage protection circuit 212. As will be described in greater detail in regard to FIG. 3, dynamic bias circuit 240 is configured to derive VPbias2 214 from either the voltage of PAD 140, or the voltage of VPbias 110, whichever is lower. Similarly, dynamic bias circuit 230 is configured to derive VNbias2 224 from either the voltage of PAD 140, or the voltage of VNbias 128, whichever is higher.

Figure 3:
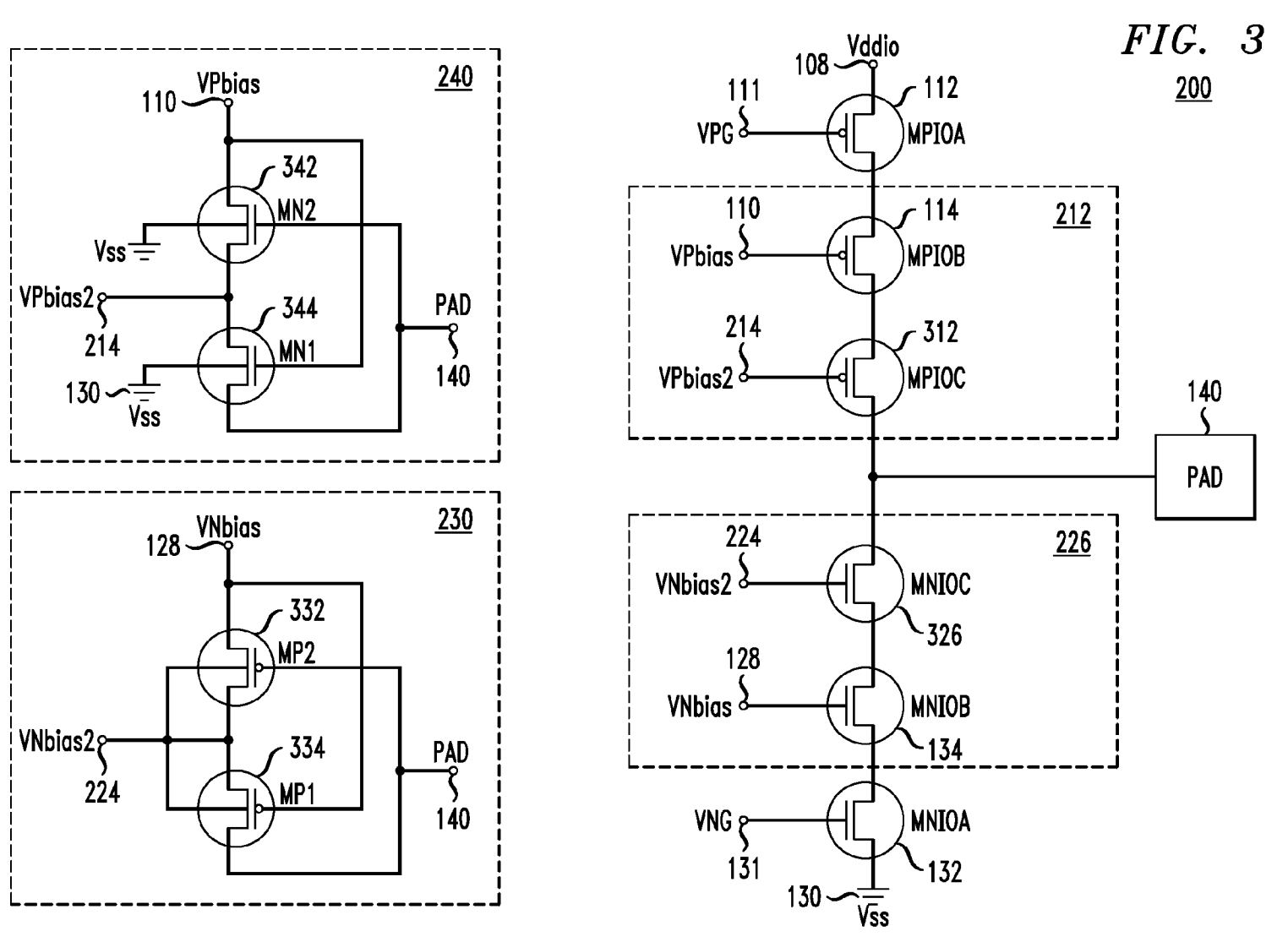

FIG. 3 shows an exemplary embodiment of SOC I/O device 200 of FIG. 2. As shown, over-voltage protection circuit 212 comprises P-channel FET MPIOC 312, and over-voltage protection circuit 226 comprises N-channel FET MNIOC 326. In an exemplary embodiment of the present invention, over-voltage protection circuit 212 might further comprise P-channel FET MPIOB 114, and over-voltage protection circuit 226 might further comprise N-channel FET MNIOB 134. MPIOC 312 is electrically coupled between the drain of MPIOB 114 and PAD 140 and has its gate is driven by the voltage of VPbias2 214. MNIOC 326 is electrically coupled between PAD 140 and the drain of MNIOB 134 and has its gate is driven by the voltage of VNbias2 224.

For example, in operation, when Vddio 108 is 3.3V, the voltage at PAD 140 may reach as high as 3.6V (3.3V+10% worst case tolerance). As would be apparent to one of skill in the art, if VNbias2 224 is set too high, when the voltage of PAD 140 is pulled low, the drain to gate voltage, Vdg, of MNIOC 326 might exceed Vmax. Similarly, if VNbias2 224 is set too low, when the voltage of PAD 140 is pulled high, the drain to source voltage, Vds, of MNIOC 326 might exceed Vmax. When the source voltage, Vs, of MNIOC 326 is equal to VNbias2−Vth, and the drain voltage, Vd, of MNIOC 326 might be equal to 3.6V.

An embodiment of the present invention dynamically adjusts the voltages of VNbias2 224 and VPbias2 214 based on the voltage of PAD 140. The voltage of VNbias2 224 is provided by dynamic bias circuit 230 and the voltage of VPbias2 214 is provided by dynamic bias circuit 240. As shown, the voltage of VNbias2 224 may either be derived from the voltage of VNbias 128 or the voltage of PAD 140. Dynamic bias circuit 230 comprises P-channel FETs MP1 334 and MP2 332. The voltage of VNbias 128 is provided to the gate of MP1 334 and to the source of MP2 332. The gate of MP2 332 and the source of MP1 334 are electrically coupled to PAD 140. The drain of MP2 332 is electrically coupled to the drain of MP1 334, thus providing the voltage of VNbias2 224. As shown, in an embodiment of the present invention, the substrates of FETs MP1 334 and MP2 332 are also electrically coupled to VNbias2 224.

Similarly, the voltage of VPbias2 214 might either be derived from the voltage of VPbias 110 or the voltage of PAD 140. Dynamic bias circuit 240 comprises N-channel FETs MN1 344 and MN2 342. The voltage of VPbias 110 is provided to the gate of MN1 344 and to the source of MN2 342. The gate of MN2 342 and the drain of MN1 344 are electrically coupled to PAD 140. The drain of MN2 342 is electrically coupled to the source of MN1 344, thus providing the voltage of VPbias2 214. As shown, in an embodiment of the present invention, the substrates of FETs MN1 344 and MN2 342 are electrically coupled to Vss 130.

Regarding dynamic bias circuit 230, when the voltage of PAD 140 is pulled high and is approximately equal to Vddio 108, MP2 332 is off because its gate voltage is equal to the voltage of PAD 140, which is high. The source voltage of MP2 332 is equal to the voltage of VNbias 128, which in one embodiment of the present invention might be equal to half of Vddio 108, and, thus, might be equal to half the voltage of PAD 140. MP1 334 is on since its gate voltage is equal to VNbias 128, and its source voltage is equal to the voltage of PAD 140, and, thus, its Vgs is low. When MP1 334 is on, the voltage of VNbias2 224 is approximately equal to the voltage of PAD 140, which is approximately equal to Vddio 108.

Regarding dynamic bias circuit 240, when the voltage of PAD 140 is pulled high and is approximately equal to Vddio 108, MN1 344 is off because its gate voltage is equal to the voltage of VPbias 110, which may be equal to half of Vddio 108. The source voltage of MN1 334 is equal to the voltage of PAD 140, which is approximately equal to Vddio 108, thus Vgs of MN1 344 is low. MN2 342 is on because its gate voltage is equal to the voltage of PAD 140, thus its Vgs is high. When MN2 342 is on, the voltage of VPbias2 214 is approximately equal to the voltage of VPbias 110, which is approximately equal to half of Vddio 108. Therefore, when the voltage of PAD 140 is pulled high, the voltage of VPbias2 214 is approximately equal to half of Vddio 108, and the voltage of VNbias2 224 is approximately equal to Vddio 108.

In one exemplary embodiment, when the voltage of PAD 140 is pulled high and, thus, VNbias2 224 is approximately equal to Vddio 108, the source voltage of MNIOC 326 is equal to VNbias2−Vth=Vddio−Vth=3.6V−0.5V=3.1V. Thus, the voltages across the terminals of MNIOC 326 are: Vgs=0.5V, Vds=0.5V and Vdg=0V, which are all below Vmax. The drain voltage of MNIOB 134 is equal to the source voltage of MNIOC 326. VNbias 128 is equal to 0.5×Vddio 108=0.5×3.6V=1.8V. Thus, the source voltage of MNIOB 134 is equal to VNbias−Vth=1.8V−0.5V=1.3V. Thus, the voltages across the terminals of MNIOB 134 are: Vgs=0.5V, Vds=3.1V−1.3V=1.8V and Vdg=3.1V−VNbias=1.3V, which are all below Vmax. The drain voltage of MNIOA 132 is equal to the source voltage of MNIOB 134. When the voltage of PAD 140 is pulled high, VNG 131 is zero and MNIOA 132 is off. Thus, the voltages across the terminals of MNIOA 132 are: Vgs=0V, Vds=1.3V−0V=1.3V and Vdg=1.3V−0V=1.3V, which are all below Vmax. Therefore, when the voltage of PAD 140 is pulled high, none of transistors 132, 134 or 326 are subject to a DC over-voltage condition.

Similarly, in one exemplary embodiment, when the voltage of PAD 140 is pulled high and, thus, VPbias2 214 is set equal to VPbias 110, the source voltage of MPIOC 312 is approximately equal to Vddio 108=3.6V. Thus, the voltages across the terminals of MPIOC 312 are: Vsg=1.8V, Vds=0V and Vdg=1.8V, which are all less than Vmax. The drain voltage of MPIOB 114 is equal to the source voltage of MPIOC 312. VPbias 110 is equal to 0.5×Vddio 108=1.8V. The source voltage of MPIOB 114 is approximately equal to Vddio 108=3.6V. Thus, the voltages across the terminals of MPIOB 114 are: Vsg=1.8V, Vds=0V and Vdg=1.8V, which are all below Vmax. The drain voltage of MPIOA 212 is equal to the source voltage of MPIOB 114. When the voltage of PAD 140 is pulled high, VPG 131 is low and MPIOA 112 is on. Thus, the voltages across the terminals of MPIOA 112 are: Vsg=1.8V, Vds=0V and Vdg=1.8V, which are all below Vmax. Therefore, when the voltage of PAD 140 is pulled high, none of transistors 112, 114 or 312 are subject to a DC over-voltage condition.

Conversely, regarding dynamic bias circuit 230, when the voltage of PAD 140 is pulled low and is approximately equal to Vss 130, MP2 332 is on since its gate voltage is equal to the voltage of PAD 140, which is low. The source voltage of MP2 332 is equal to the voltage of VNbias 128, which in one embodiment of the present invention may be equal to half of Vddio 108 and, thus, its Vgs is low. When MP2 332 is on, VNbias2 224 is approximately equal to VNbias 128. MP1 334 is off because its gate voltage is equal to VNbias 128, and its source voltage is equal to the voltage of PAD 140, which is pulled low and, thus, its Vgs is high.

Regarding dynamic bias circuit 240, when the voltage of PAD 140 is pulled low and is approximately equal to Vss 130, MN1 344 is on because its gate voltage is equal to the voltage of VPbias 110, which may be equal to half of Vddio 108. The source voltage of MN1 344 is equal to the voltage of PAD 140, which is approximately equal to Vss 130 and, thus, Vgs of MN1 344 is high. MN2 342 is off because its gate voltage is equal to the voltage of PAD 140, which is low, thus its Vgs is low. When MN1 344 is on, the voltage of VPbias2 214 is approximately equal to the voltage of PAD 140, which is approximately equal to Vss 130. Therefore, when the voltage of PAD 140 is pulled low, the voltage of VPbias2 214 is approximately equal to Vss 130, and the voltage of VNbias2 224 is approximately equal to half of Vddio 108.

In one exemplary embodiment, when the voltage of PAD 140 is pulled low and, thus, VNbias2 224 is equal to VNbias 128, the source voltage of MNIOC 326 is approximately equal to Vss 130=0V. Thus, the voltages across the terminals of MNIOC 326 are: Vgs=1.8V, Vds=0V and Vgd=1.8V, which are all below Vmax. The drain voltage of MNIOB 134 is equal to the source voltage of MNIOC 326=0V. VNbias 128 is equal to 0.5×Vddio 108=1.8V, which is the source voltage of MNIOB 134. Thus, the voltages across the terminals of MNIOB 134 are: Vgs=1.8V, Vds=0V and Vgd=1.8V, which are all below Vmax. The drain voltage of MNIOA 132 is equal to the source voltage of MNIOB 134=0V. When the voltage of PAD 140 is pulled low, VNG 131 is high and MNIOA 132 is on. Thus, the voltages across the terminals of MNIOA 132 are: Vgs=1.8V, Vds=0V and Vgd=1.8V, which are all below Vmax. Therefore, when the voltage of PAD 140 is pulled low, transistors 132, 134 or 326 are generally not exposed to a DC over-voltage condition.

Similarly, when the voltage of PAD 140 is pulled low and, thus, the voltage of VPbias2 214 is equal to the voltage of PAD 140, the source voltage of MPIOC 312 is equal to VPbias2+Vth=Vss+Vth=0.5V. Thus, the voltages across the terminals of MPIOC 312 are: Vsg=0.5V, Vsd=0.5V and Vdg=0V, which are all below Vmax. The drain voltage of MPIOB 114 is equal to the source voltage of MPIOC 312=0.5V. VPbias 110 is equal to 0.5×Vddio 108=1.8V. The source voltage of MPIOB 114 is equal to VPbias+Vth=1.8V+0.5V=2.3V. Thus, the voltages across the terminals of MPIOB 114 are: Vsg=0.5V, Vsd=1.8V and Vgd=1.3V, which are all below Vmax. The drain voltage of MPIOA 112 is equal to the source voltage of MPIOB 114=2.3V. When the voltage of PAD 140 is pulled low, VPG 131 is high, and MPIOA 112 is off. Thus, the voltages across the terminals of MPIOA 112 are: Vsg=0V, Vds=1.3V and Vgd=1.3V, which are all below Vmax. Therefore, when the voltage of PAD 140 is pulled low, none of transistors 112, 114 or 312 are subject to a DC over-voltage condition.

Transistors 112, 114, 312, 132, 134 and 326 are also protected from transient over-voltage conditions that could arise when PAD 140 is coupled to a capacitive load since dynamic bias circuits 230 and 240 dynamically adjust the voltages of VNbias2 224 and VPbias2 214 based on the voltage of PAD 140. Thus, 26 Angstrom, 1.8V devices for pull-up and pull-down can be used to support both high speed performance and higher voltage legacy protocols without damaging the devices due to over-voltage conditions.

In an alternative embodiment of the present invention, VPbias 110 and VNbias 128 are combined into a single voltage, Vbias (not shown), which tracks Vddio 108 in a fixed ratio, which ratio might be, for example, one half. In one embodiment, Vbias, VPbias or VNbias may be generated internally to the chip containing I/O device 200, or alternatively may be supplied from external circuitry. Similarly, in an alternative embodiment, VPbias2 214 and VNbias2 224 may be supplied from external circuitry.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

While the exemplary embodiments of the present invention have been described with respect to processes of circuits, including possible implementation as a single integrated circuit, a multi-chip module, a single card, or a multi-card circuit pack, the present invention is not so limited. As would be apparent to one skilled in the art, various functions of circuit elements may also be implemented as processing blocks in a software program. Such software may be employed in, for example, a digital signal processor, micro-controller, or general-purpose computer.

Although the elements in the following method claims, if any, are recited in a particular sequence with corresponding labeling, unless the claim recitations otherwise imply a particular sequence for implementing some or all of those elements, those elements are not necessarily intended to be limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

Signals and corresponding nodes or ports may be referred to by the same name and are interchangeable for purposes here. Transistors are typically shown as single devices for illustrative purposes. However, it is understood by those with skill in the art that transistors will have various sizes (e.g., gate width and length) and characteristics (e.g., threshold voltage, gain, etc.) and may consist of multiple transistors coupled in parallel to get desired electrical characteristics from the combination. Further, the illustrated transistors may be composite transistors.

As used in this specification and claims, the term "output node" refers generically to either the source or drain of a metal-oxide semiconductor (MOS) transistor device (also referred to as a MOSFET or FET), and the term "control node" refers generically to the gate of the FET. Similarly, as used in the claims, the terms "source," "drain," and "gate" should be understood to refer either to the source, drain, and gate of a FET or to the emitter, collector, and base of a bi-polar device when the present invention is implemented using bi-polar transistor technology.

We claim:

1. A method for protection from an over-voltage condition in an input/output ("I/O") buffer having first and second I/O transistors, wherein the first I/O transistor is coupled to a first over-voltage protection circuit, and the second I/O transistor is coupled to a second over-voltage protection circuit, comprising:
   a) generating first and second bias voltages from an operating voltage of the buffer;
   b) generating a third bias voltage from either i) the first bias voltage, or ii) an output signal voltage of the buffer;
   c) generating a fourth bias voltage from either i) the second bias voltage, or ii) the output signal voltage of the buffer;
   d) providing the third and fourth bias voltages to the first and second over-voltage protection circuits, respectively;
   e) preventing, by the first over-voltage protection circuit, the over-voltage condition on at least the first I/O transistor, wherein the first I/O transistor comprises a P-channel FET, and the first over-voltage protection circuit comprises a first over-voltage protection transistor and a second over-voltage protection transistor, wherein the first and second over-voltage protection transistors comprise P-channel field effect transistors (FETs), and
   f) preventing, by the second over-voltage protection circuit, the over-voltage condition on at least the second I/O transistor, wherein the second I/O transistor comprises an N-channel FET, and the second over-voltage protection circuit comprises (i) a third over-voltage protection transistor and (ii) a fourth over-voltage protection transistor, wherein the third and fourth over-voltage protection transistors comprise N-channel FETs,
   wherein the over-voltage condition comprises at least one of a DC and a transient over-voltage condition, and wherein the FETs are fabricated with a gate oxide thickness of substantially 26 Angstroms.

2. The method as recited in claim 1, wherein, the first bias voltage and the second bias voltage are the same signal.

3. An apparatus for protection from an over-voltage condition in an input/output ("I/O") buffer having first and second I/O transistors, wherein the first I/O transistor is coupled to a first over-voltage protection circuit, and the second I/O transistor is couple to a second over-voltage protection circuit, comprising:
   a) a first bias voltage and a second bias voltage;
   b) a first dynamic bias circuit to generate a third bias voltage from either i) the first bias voltage, or ii) an output signal voltage of the buffer, wherein the first dynamic bias circuit comprises a first and a second N-channel field effect transistor (FET);
   c) a second dynamic bias circuit to generate a fourth bias voltage from either i) the second bias voltage, or ii) an output signal voltage of the buffer, wherein the second dynamic bias circuit comprises a first and a second P-channel FET;
   d) a first over-voltage protection circuit driven by the third bias voltage, wherein the first over-voltage protection circuit is adapted to prevent DC and transient over-voltage conditions on the first I/O transistor and wherein the first over-voltage protection circuit comprises (i) a first over-voltage protection transistor and (ii) a second over-voltage protection transistor, wherein the first and second over-voltage protection transistors comprise P-channel FETs; and e) a second over-voltage protection circuit driven by the fourth bias voltage, wherein the second over-voltage protection circuit is adapted to prevent DC and transient over-voltage conditions on the second I/O transistor and wherein the second over-voltage protection circuit comprises (i) a third over-voltage protection transistor and (ii) a fourth over-voltage protection transistor, wherein the third and fourth over-voltage protection transistors comprise N-channel FETs;

wherein the first I/O transistor comprises a P-channel FET and the second I/O transistor comprises an N-channel FET, and wherein the FETs are fabricated with a gate oxide thickness of substantially 26 Angstroms.

4. The apparatus as recited in claim 3, wherein the first I/O transistor is configured to pull-up the output signal voltage of the buffer, and the second I/O transistor is configured to pull-down the output signal voltage of the buffer.

5. The apparatus as recited in claim 3, wherein the first over-voltage protection transistor is driven by the first bias voltage, and the second over-voltage transistor is driven by the third bias voltage, and wherein the third over-voltage protection transistor is driven by the second bias voltage and the fourth over-voltage transistor is driven by the fourth bias voltage.

6. The apparatus as recited in claim 3, wherein when the output signal voltage of the buffer is high, the first dynamic bias circuit sets the third bias voltage to the lower of either i) the first bias voltage or ii) the output signal voltage of the buffer, and the second dynamic bias circuit sets the fourth bias voltage to the higher of either i) the second bias voltage or ii) the output signal voltage of the buffer.

7. The apparatus as recited in claim 3, wherein the first bias voltage and the second bias voltage are generated from an operating voltage of the I/O buffer.

8. The apparatus as recited in claim 7, wherein the first bias voltage and the second bias voltage are each a fixed ratio of the operating voltage of the I/O buffer.

9. The apparatus as recited in claim 7, wherein the operating voltage of the I/O buffer is 3.3V with +/−10% tolerance.

10. The apparatus as recited in claim 7, wherein the first bias voltage and the second bias voltage are the same signal.

11. The apparatus as recited in claim 3, wherein the apparatus is implemented in an integrated circuit.

12. An apparatus for protection from an over-voltage condition in an input/output ("I/O") buffer having first and second I/O transistors, wherein the first I/O transistor is coupled to a first over-voltage protection circuit, and the second I/O transistor is couple to a second over-voltage protection circuit, comprising:

a) a first bias voltage;
b) a first dynamic bias circuit configured to generate a second bias voltage from either i) the first bias voltage, or ii) an output signal voltage of the buffer, wherein the first dynamic bias circuit comprises a first and a second N-channel field effect transistor (FET);
c) a second dynamic bias circuit configured to generate a third bias voltage from either i) the first bias voltage, or ii) the output signal voltage of the buffer, wherein the second dynamic bias circuit comprises a first and a second P-channel FET;
d) a first over-voltage protection circuit further comprising a first over-voltage protection transistor driven by the first bias voltage and a second over-voltage protection transistor driven by the second bias voltage, wherein the first over-voltage protection circuit is adapted to prevent DC and transient over-voltage conditions on the first I/O transistor, wherein the first and second over-voltage protection transistors comprise P-channel FETs; and
e) a second over-voltage protection circuit further comprising a third over-voltage protection transistor driven by the first bias voltage and a fourth over-voltage protection transistor driven by the third bias voltage, wherein the second over-voltage protection circuit is adapted to prevent DC and transient over-voltage conditions on the second I/O transistor, wherein the third and fourth over-voltage protection transistors comprise N-channel FETs, wherein the first I/O transistor comprises a P-channel FET and the second I/O transistor comprises an N-channel FET, and wherein the FETs are fabricated with a gate oxide thickness of substantially 26 Angstroms.

13. The apparatus as recited in claim 12, wherein the first dynamic bias circuit is configured to set the third bias voltage to the lower of either i) the first bias voltage or ii) the output signal voltage of the buffer, and the second dynamic bias circuit is configured to set the fourth bias voltage to the higher of either i) the second bias voltage or ii) the output signal voltage of the buffer.

14. The apparatus as recited in claim 12, wherein the apparatus is implemented in an integrated circuit.

* * * * *